(12) United States Patent
Wang (10) Patent No.: US 10,579,170 B2
(45) Date of Patent: Mar. 3, 2020

(54) TOUCH CONTROL SUBSTRATE, TOUCH CONTROL PANEL, DISPLAY SUBSTRATE, DISPLAY PANEL AND DISPLAY DEVICE

(71) Applicant: BOE Technology Group Co., Ltd., Beijing (CN)

(72) Inventor: Mingxi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/950,269

(22) Filed: Apr. 11, 2018

(65) Prior Publication Data

US 2019/0056811 A1    Feb. 21, 2019

(30) Foreign Application Priority Data

Aug. 17, 2017   (CN) .......................... 2017 1 0706659

(51) Int. Cl.
| | |
|---|---|
| *G06F 3/041* | (2006.01) |
| *G02F 1/1345* | (2006.01) |
| *G02F 1/1362* | (2006.01) |
| *H01L 27/32* | (2006.01) |
| *G06F 3/044* | (2006.01) |

(52) U.S. Cl.
CPC .......... *G06F 3/041* (2013.01); *G02F 1/13452* (2013.01); *G06F 3/0416* (2013.01); *G02F 2001/13629* (2013.01); *G06F 3/044* (2013.01); *G06F 3/0412* (2013.01); *G06F 2203/04103* (2013.01); *G09G 2300/0426* (2013.01); *H01L 27/323* (2013.01); *H01L 27/3276* (2013.01)

(58) Field of Classification Search
CPC ........ G09G 2300/0426; G02F 1/13452; G02F 2001/13629; G02F 1/136286; H05K 2201/10128; G06F 3/044; G06F 3/0412; G06F 17/5077
See application file for complete search history.

(56) References Cited

U.S. PATENT DOCUMENTS

| 10,431,136 B2 | 10/2019 | Zhou | |
|---|---|---|---|
| 2004/0108977 A1* | 6/2004 | Hirayama | ................ G09G 3/20 345/76 |

(Continued)

FOREIGN PATENT DOCUMENTS

| CN | 104598074 A | 5/2015 |
|---|---|---|
| CN | 105653087 A | 6/2016 |

(Continued)

OTHER PUBLICATIONS

Office Action dated Sep. 18, 2019 issued in corresponding Chinese Application No. 201710706659.2.

*Primary Examiner* — Sanjiv D. Patel
(74) *Attorney, Agent, or Firm* — Nath, Goldberg & Meyer; Joshua B. Goldberg; Daniel Bissing (57) ABSTRACT

A touch control substrate, a touch control panel, a display substrate, a display panel and a display device are provided in the application. The touch control substrate includes a touch region and a frame wiring region. A plurality of electrode lines in the frame wiring region are distributed in different layers, and orthogonal projections, on a projection plane, of the plurality of electrode lines distributed in the different layers are overlapped, the projection plane being a plane parallel to the touch control substrate.

19 Claims, 5 Drawing Sheets

(56) References Cited

U.S. PATENT DOCUMENTS

| | | | | |
|---|---|---|---|---|
| 2006/0138461 A1* | 6/2006 | Abe | ............... | G02F 1/136286 |
| | | | | 257/202 |
| 2010/0085326 A1* | 4/2010 | Anno | ............... | G06F 3/044 |
| | | | | 345/174 |
| 2011/0298747 A1* | 12/2011 | Kim | ............... | G06F 3/044 |
| | | | | 345/174 |
| 2013/0277650 A1* | 10/2013 | Yoneya | ............... | H01L 27/3276 |
| | | | | 257/40 |
| 2015/0309531 A1* | 10/2015 | Tanemura | ............... | G06F 1/16 |
| | | | | 345/174 |
| 2015/0331524 A1* | 11/2015 | McMillen | ............... | G01L 1/18 |
| | | | | 345/174 |
| 2016/0037631 A1* | 2/2016 | Payne | ............... | H05K 1/0306 |
| | | | | 174/251 |
| 2019/0012026 A1 | 1/2019 | Li et al. | | |

FOREIGN PATENT DOCUMENTS

| | | |
|---|---|---|
| CN | 205643979 U | 10/2016 |
| CN | 106527801 A | 3/2017 |
| CN | 106775124 A | 5/2017 |
| CN | 206147578 U | 5/2017 |
| CN | 107039467 A | 8/2017 |

* cited by examiner

TOUCH CONTROL SUBSTRATE, TOUCH CONTROL PANEL, DISPLAY SUBSTRATE, DISPLAY PANEL AND DISPLAY DEVICE

CROSS-REFERENCE TO RELATED APPLICATIONS

The present disclosure claims the priority of Chinese Patent Application No. 201710706659.2, filed on Aug. 17, 2017, the contents of which are incorporated herein by reference in its entirety.

TECHNICAL FIELD

The present disclosure relates to the field of display technology, and in particular, to a touch control substrate, a touch control panel, a display substrate, a display panel, and a display device.

BACKGROUND

At present, display products having light weight, thinness and high texture are increasingly pursued, and a narrow frame design has always been a technology that enhances the product texture. In a current touch display screen, both the display screen and the touch control screen need the narrow frame design in order to realize the narrow frame of the overall touch control display screen.

SUMMARY

A touch control substrate, a touch control panel, a display substrate, a display panel, and a display device are provided in the disclosure.

According to an aspect of the disclosure, there is provided a touch control substrate, including a touch region and a frame wiring region. A plurality of electrode lines in the frame wiring region are distributed in different layers, and orthogonal projections, on a projection plane, of the plurality of electrode lines distributed in the different layers are overlapped, the projection plane being a plane parallel to the touch control substrate.

Optionally, the plurality of electrode lines in the frame wiring region include driving signal lines and sensing signal lines, and the driving signal lines are located in a different layer from the sensing signal lines, and an insulating layer is provided between adjacent layers.

Optionally, orthogonal projections of the driving signal lines on the projection plane are completely overlapped with orthogonal projections of the sensing signal lines on the projection plane.

Optionally, orthogonal projections of the driving signal lines on the projection plane are partially overlapped with orthogonal projections of the sensing signal lines on the projection plane.

Optionally, in the frame wiring region, each electrode line and an electrode connected thereto are in a same layer, and electrodes arranged in different layers are arranged to form different straight lines, and orthogonal projections of the different straight lines on the projection plane are parallel to each other.

Optionally, in the frame wiring region, each electrode line and an electrode connected thereto are in a same layer, and electrodes in different layers are arranged to form different straight lines, and orthogonal projections of the different straight lines on the projection plane are overlapped with each other.

According to an aspect of the disclosure, there is provided a touch control panel, including the touch control substrate described above.

According to an aspect of the disclosure, there is provided a display substrate, including a display region and a non-display region. A plurality of electrode lines in the non-display region are distributed in different layers, and orthogonal projections on a projection plan of the plurality of electrode lines distributed in the different layers are overlapped, the projection plane being a plane parallel to the display substrate.

Optionally, the plurality of electrode lines in the non-display region include gate lines, data lines, and common electrode lines; the gate lines, the data lines, and the common electrode lines are located in different layers, respectively, and an insulating layer is provided between adjacent layers.

Optionally, orthogonal projections, on the projection plane, of the gate lines, the data lines, and the common electrode lines are completely overlapped with each other.

Optionally, orthogonal projections on the projection plane of the gate lines, the data lines, and the common electrode lines are partially overlapped with each other.

Optionally, in the non-display region, each electrode line and an electrode connected thereto are in a same layer, and electrodes arranged in different layers are arranged to form different straight lines, orthogonal projections of the different straight lines on the projection plane are parallel to each other.

Optionally, in the frame wiring region, each electrode line and an electrode connected thereto are in a same layer, and electrodes arranged in different layers are arranged to form different straight lines, orthogonal projections of the different straight lines on the projection plane are overlapped with each other.

According to an aspect of the disclosure, there is provided a display panel, including the display substrate described above.

According to an aspect of the disclosure, there is provided a display device, including a display panel and a touch control panel configured to perform touch control on display of the display panel. The display panel includes a display substrate, and the display substrate includes a display region and a non-display region. A plurality of electrode lines in the non-display region are distributed in different layers, and orthogonal projections, on a first projection plane, of the plurality of electrode lines distributed in the different layers are overlapped, the first projection plane being a plane parallel to the display substrate. The touch control panel includes a touch control substrate, and the touch control substrate includes a touch region and a frame wiring region, a plurality of electrode lines in the frame wiring region are distributed in different layers, and orthogonal projections on a second projection plane of the plurality of electrode lines distributed in the different layers are overlapped, the second projection plane being a plane parallel to the touch control substrate.

BRIEF DESCRIPTION OF THE DRAWINGS

FIG. 6-1 illustrates a cross-sectional structural view of a display substrate according to an embodiment of the present disclosure;

FIG. 6-2 illustrates another cross-sectional structural view of a display substrate according to an embodiment of the present disclosure;

DETAILED DESCRIPTION

To enable those skilled in the art to better understand the technical solutions of the present disclosure, a touch control substrate, a touch control panel, a display substrate, a display panel, and a display device provided by the present disclosure will be further described below in conjunction with the accompanying drawings and specific embodiments. In the present disclosure, the same reference numerals denote the same elements.

Figure 1:
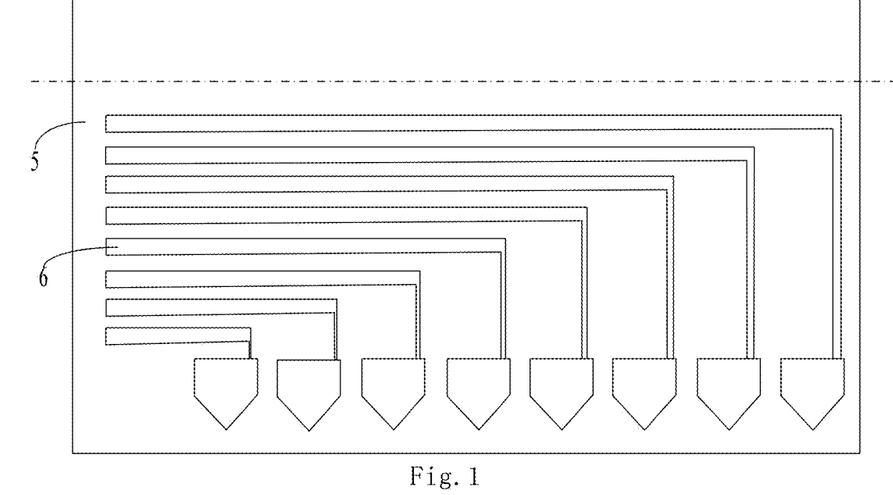
FIG. 1 is a schematic diagram of wiring distribution in a frame region of a touch control screen and a display screen.

FIG. 1 is a schematic diagram of distribution of wiring in a frame region of a touch control screen and a display screen. As shown in FIG. 1, wiring 6 in a frame region 5 of a touch control screen and a display screen occupies a relatively large area, resulting in a relatively wide width of the frame region 5, which is not conducive to implementation of a narrow frame. In addition, the touch screen and the display screen have not been able to achieve a narrow frame design due to the requirements on process capability and production cost.

Therefore, how to realize a narrow frame of the display screen and the touch screen without increasing the process capability and the production cost has become a technical problem that needs to be solved urgently.

Figure 2:
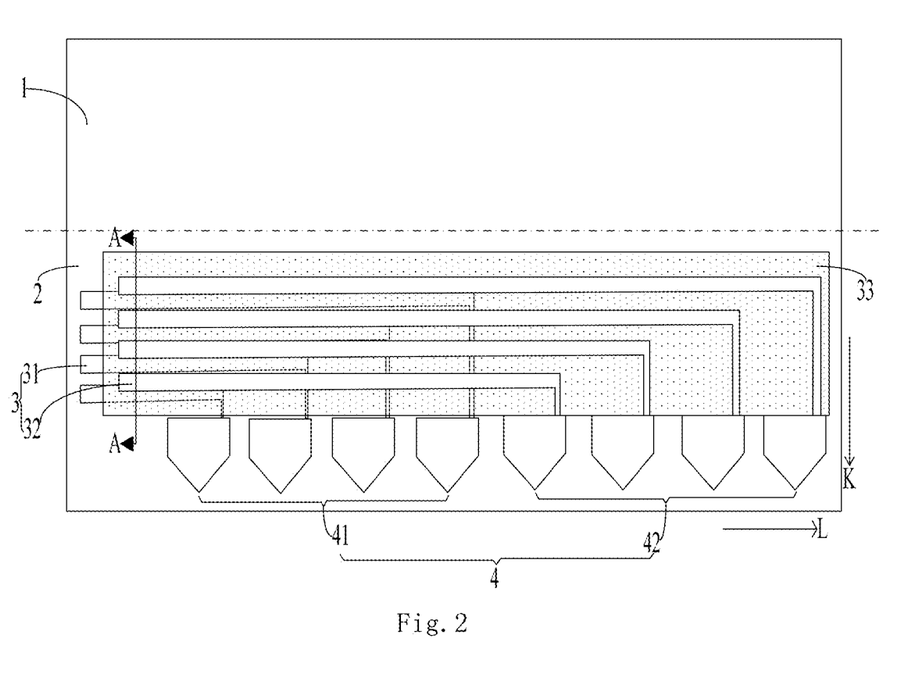
FIG. 2 is a schematic top view showing distribution of electrodes and electrode lines in a frame wring region of a touch control substrate in an embodiment of the present disclosure.
Figure 3:
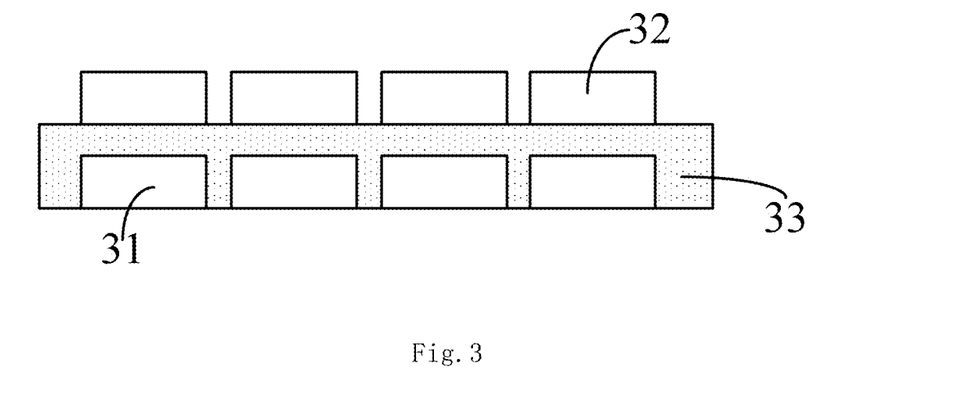
FIG. 3 is a cross-sectional structural view of the touch control substrate taken along line AA in FIG. 2.

FIG. 2 is a schematic top view showing distribution of electrodes and electrode lines in a frame wring region of a touch control substrate in an embodiment of the present disclosure. FIG. 3 is a cross-sectional structural view of the touch control substrate taken along line AA in FIG. 2. As shown in FIG. 2 and FIG. 3, the embodiment provides a touch control substrate including a touch region 1 and a frame wiring region 2. A plurality of electrode lines 3 in the frame wiring region 2 are distributed in different layers, such as two layers. The plurality of electrode lines 3 include driving signal lines 31 and sensing signal lines 32. For example, the driving signal lines 31 are located in a second layer, and the sensing signal lines 32 are located in a first layer. Orthogonal projections, on a projection plane, of the driving signal lines 31 and the sensing signal lines 32 distributed in different layers are overlapped, and the projection plane is a plane parallel to the touch control substrate.

It should be noted that, in the embodiment, the orthographic projections, on the projection plane, of the electrode lines 31 and the electrode lines 32 distributed in each layer form an entire region, and the arrangement width of the electrode lines 3 in the frame wiring region 2 can be reduced as long as the orthogonal projections of the driving signal lines 31 and the sensing signal lines 32 distributed in different layers are overlapped in the entire region. FIG. 2 shows a case where the orthogonal projections, on the projection plane, of the driving signal lines 31 and the sensing signal lines 32 distributed in the respective layers are overlapped. This case is merely an example of the situation that the orthogonal projections, on the projection plane, of electrode lines 3 distributed in different layers are overlapped, but the invention is not limited thereto.

By distributing the electrode lines 3 of the frame wiring region 2 in different layers, and overlapping the orthogonal projections, on the projection plane, of the driving signal lines 31 and the sensing signal lines 32 distributed in different layers, the arrangement width of the electrode lines 3 in the frame wiring region 2 can be greatly reduced, as compared with a case where the electrode lines 3 are all distributed in a same layer in existing art. As a result, the width and area of the frame occupied by the electrode lines 3 in the frame wiring region 2 can be greatly reduced, so as to realize the narrow frame of the touch control substrate.

FIG. 2 is a schematic top view showing distribution of electrodes and electrode lines in a frame wiring region of the touch control substrate in an embodiment of the present disclosure. As shown in FIG. 2, the plurality of electrode lines 3 of the frame wiring region 2 include driving signal lines 31 and sensing signal lines 32. The driving signal lines 31 and the sensing signal lines 32 are respectively located in different layers (e.g., two layers). There is an insulating layer 33 between adjacent layers. Compared with a case where the driving signal lines 31 and the sensing signal lines 32 are arranged in a same layer of the frame wiring region 2, the touch control substrate 31 of the present disclosure greatly reduces an arrangement width of the driving signal lines 31 and the sensing signal lines 32 in the frame wiring region 2 by arranging the driving signal lines 31 and the sensing signal lines 32 in different layers. The driving signal lines 31 and the sensing signal lines 32 arranged in different layers in the frame wiring region only need to be formed simultaneously with the driving electrodes and the sensing electrodes in the corresponding touch control region 1, respectively, without adding additional preparation process and steps of the touch control substrate, so that the implementation of the narrow frame of the touch control substrate and cost saving can be achieved.

It should be noted that orthographic projections of each driving signal line 31 and each sensing signal line 32 on the projection plane may be overlapped completely or partially.

FIG. 3 illustrates a case where the orthographic projections of each driving signal line 31 and a respective one of sensing signal line 32 on the projection plane are overlapped completely. As shown in FIG. 3, the orthogonal projection, on the projection plane, of the driving signal lines 31 located in the second layer may be completely overlapped with the orthogonal projection, on the projection plane, of the sensing signal lines 32 located in the first layer. In other words, each driving signal line 31 in the second layer is located right below the respective one of the sensing signal lines 32 in the first layer, so as to ensure the smallest width of the frame wiring region 2 occupied by the driving signal lines 31 and the sensing signal lines 32 distributed in the two layers.

Figure 4:
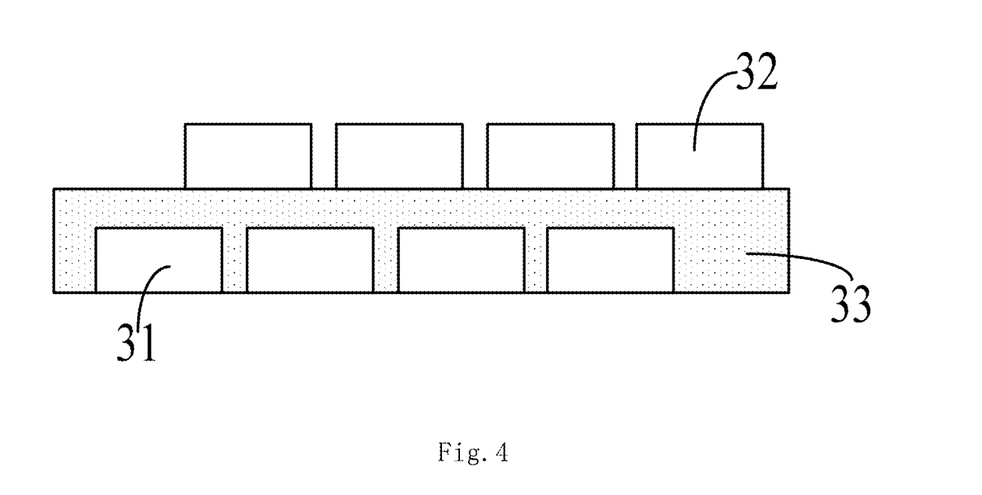
FIG. 4 is another cross-sectional structural view of the touch control substrate taken along line AA in FIG. 2.

FIG. 4 is another cross-sectional structural view of the touch control substrate taken along line AA in FIG. 2. FIG. 4 shows a case where the orthographic projection of each of the driving signal lines 31 on the projection plane is partially overlapped with the orthographic projection of at least one of the sensing signal lines 32 on the projection plane. As shown in FIG. 4, the orthogonal projections of the driving signal lines 31 in the second layer on the projection plane and the orthogonal projections of the sensing signal lines 32 in the first layer on the projection plane may be partially overlapped with each other. In other words, the orthogonal projections, on the projection plane, of the driving signal lines 31 located in the second layer and the sensing signal lines 32 located in the first layer may be staggered with each other. As shown in FIG. 4, the orthographic projection of each of the driving signal lines 31 on the projection plane is overlapped with the orthographic projection(s) of one or two of the driving signal lines 31 on the projection plane. In this way, the width of the frame wiring region 2 is also significantly reduced, as compared with a case where the driving signal lines 31 and the sensing signal lines 32 are sequentially arranged in a same layer; at the same time, the staggered design can also reduce the interference between the sensing signal lines 32 and the driving signal lines 31, so as to ensure the stability of the signal transmission.

The arrangement of electrodes is described by taking a case where the plurality of electrode lines are arranged in two layers as an example in the above embodiment. However, a person skilled in the art can readily know that the plurality of electrode lines are arranged in three or more layers. Thereinafter, arrangement of electrodes connected to the electrode lines is described.

As shown in FIG. 2, in this embodiment, in the frame wiring region 2, the electrodes 41 and 42 respectively connected with the respective electrode lines 31 and 32 are respectively located in the layer where the electrode lines 31 and 32 are located. The electrodes 41 or 42 in different layers are arranged to form different straight lines, and the orthogonal projections of the straight lines on the projection plane are overlapped with each other.

In an embodiment, in the frame wiring region 2, the electrodes 41 connected with the driving signal lines 31 are located in the layer where the driving signal lines 31 are located, and the electrodes 42 connected with the sensing signal lines 32 are located in the layer where the sensing signal lines 32 are located. The electrodes 41 connected with the driving signal lines 31 are arranged to form a first straight line, the electrodes 42 connected with the sensing signal lines 32 are arranged to form a second straight line, and the orthogonal projections of the first straight line and the second straight line on the projection plane are in one straight line. Since the orthogonal projections, on the projection plane, of the different straight lines formed by arranging the electrodes 41 connected with the driving signal lines 31 and the electrodes 42 connected with the sensing signal lines 32 are in one straight line, and the straight line is extended along a length direction L of the frame wiring region 2 of the touch control substrate, the width of the frame wiring region 2 is not increased additionally; in addition, the driving signal lines 31 and the sensing signal lines 32 are respectively distributed in two different layers, and with such arrangement of the electrode lines and the electrodes 4, the width of the frame wiring region 2 can be reduced significantly, so as to realize the narrow frame of the touch control substrate.

It should be noted that the electrodes 41 connected with the driving signal lines 31 and the electrodes 42 connected with the sensing signal lines 32 may also be in a same layer.

In addition, it should be noted that, based on the above arrangement of the electrodes 4 in this embodiment, binding electrodes of a binding connection terminal of a peripheral circuit board used for binding with the touch control substrate may be arranged in a conventional manner. The normal binding connection between the bonding connection terminal and the touch control substrate can be realized without changing the arrangement of the bonding electrodes.

In addition, in order to further reduce the width of the frame of the touch control substrate, the electrode lines 3 of the frame wiring region 2 may be distributed in three or more layers. The number of the layers where the electrode lines 3 in the frame wiring region 2 are distributed is not limited.

Another arrangement of the electrodes connected to the electrode lines is described below. In the following, the arrangement of the electrodes will be described by taking a case where the plurality of electrode lines are arranged in two layers as an example. However, a person skilled in the art should know that the plurality of electrode lines may be arranged in three or more layers.

Figure 5:
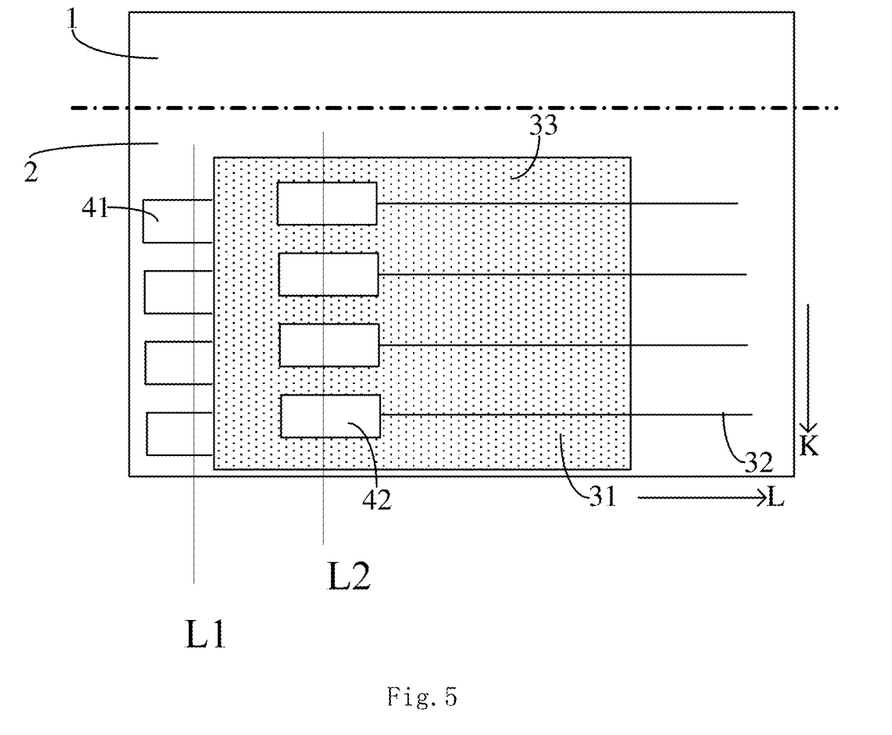
FIG. 5 is a schematic top view showing another distribution of electrodes and electrode lines in a frame wiring region of a touch control substrate according to an embodiment of the present disclosure.

FIG. 5 is a schematic top view of another distribution of electrodes and electrode lines in a frame wiring region of a touch control substrate according to an embodiment of the present disclosure. As shown in FIG. 5, in the frame wiring region 2, the electrodes 41 and 42 respectively connected with the respective electrode lines 31 and 32 are located in the layers where the electrode lines 31 and 32 are located, respectively. The electrodes 41 and 42 in different layers are arranged to form different straight lines L1 and L2, and the straight lines L1 and L2 are parallel to each other.

FIG. 5 shows a case where the orthogonal projections, on the projection plane, of the electrode lines 31 and 32 distributed in the respective layers are overlapped. This case also belongs to the situation that the orthogonal projections, on the projection plane, of electrode lines 3 distributed in different layers are overlapped. It should be noted that, for the simplicity of FIG. 5, only thin lines are shown.

In an embodiment, in the frame wiring region 2, the electrodes 41 connected with the driving signal lines 31 are located in the layer where the driving signal lines 31 are located, and the electrodes 42 connected with the sensing signal lines 32 are located in the layer where the sensing signal lines 32 are located. The electrodes 41 connected with the driving signal lines 31 are arranged to form a first straight line L1, and the electrodes 42 connected with the sensing signal lines 32 are arranged to form a second straight line L2. The first straight line L1 and the second straight line L2 are parallel to each other and staggered.

With this arrangement, on the one hand, both the electrodes 41 connected with the driving signal lines 31 and the electrodes 42 connected with the sensing signal lines 32 can be exposed, so that the electrodes 41 connected with the driving signal lines 31 and the electrodes 42 connected with the sensing signal lines 32 can be normally bound with the binding connection terminal of the peripheral circuit board. On the other hand, the first straight line and the second straight line both extend along a width direction K of the frame wiring region 2, and the electrodes 41 and 42 arranged in the width direction K of the frame wiring region 2 can be distributed in two different layers, as a result, compared with a case where the electrodes are sequentially distributed in a same layer along the width direction K of the frame wiring region 2, the arrangement width of the electrodes 4 in the width direction K of the frame wiring region 2 is greatly reduced, and thus the frame width and the frame area occupied by the electrodes 41 and 42 and the electrode line 31 and 32 in the frame wiring region 2 are greatly reduced, so as to realize the narrow frame of the touch control substrate.

It should be noted that, based on the above arrangement of the electrodes 4 in this embodiment, the binding electrodes of the binding connection terminal of the peripheral circuit board for binding with the touch control substrate also need to be disposed in two layers that are insulated from each other. In the binding, a normal binding connection between the binding connection terminal and the touch control substrate can be achieved, as long as the binding electrodes of the binding connection terminal of the peripheral circuit board are connected to the electrodes 4 on the touch control substrate in one-to-one correspondence.

According to the touch control substrate of the present disclosure, by distributing the electrode lines of the frame wiring region in different layers, and overlapping the orthogonal projections, on the projection plane, of the electrode lines distributed in different layers, the arrangement width of the electrode lines 3 in the frame wiring region 2 can be greatly reduced, as compared with a case where the electrode lines 3 are all distributed in a same layer. As a result, the width and area of the frame occupied by the electrode lines 3 in the frame wiring region 2 can be greatly reduced, so as to realize the narrow frame of the touch control substrate.

According to an embodiment of the disclosure, a touch control panel is provided, and the touch control panel includes the touch control substrate in any one of the above embodiments.

With the touch control substrate of the present disclosure, the frame of the touch panel can be narrowed, so as to realize a narrow frame of the touch control panel.

Figure 7:
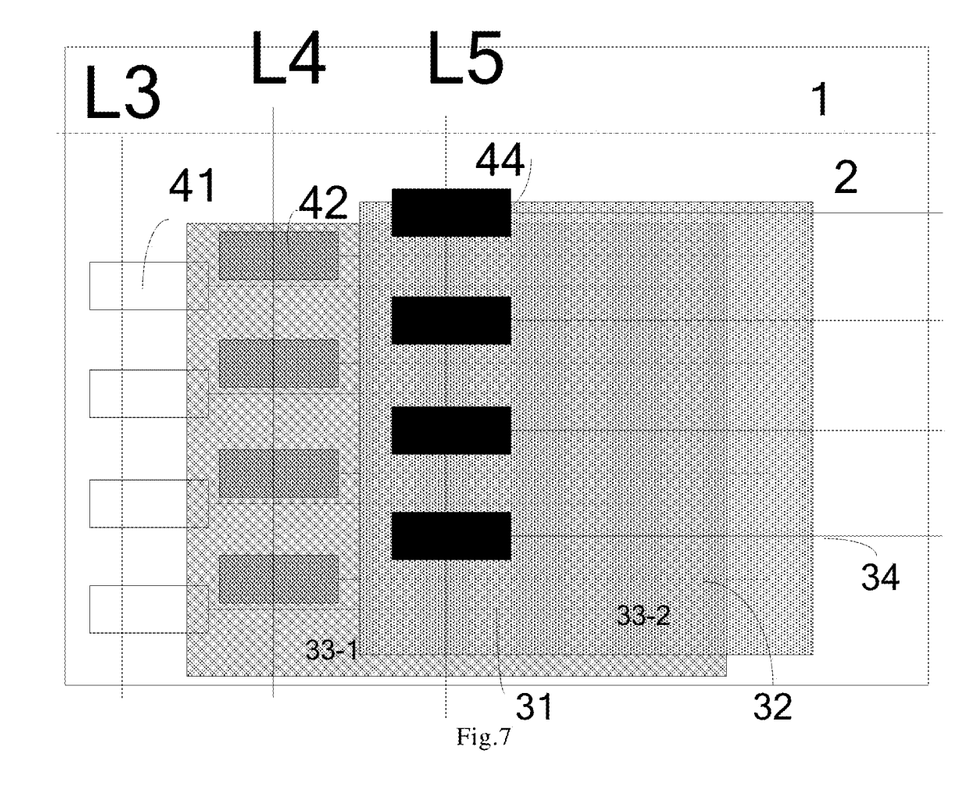
FIG. 7 is a schematic top view showing distribution of electrode lines in a frame wiring region in a display substrate according to an embodiment of the present disclosure.
Figure 8:
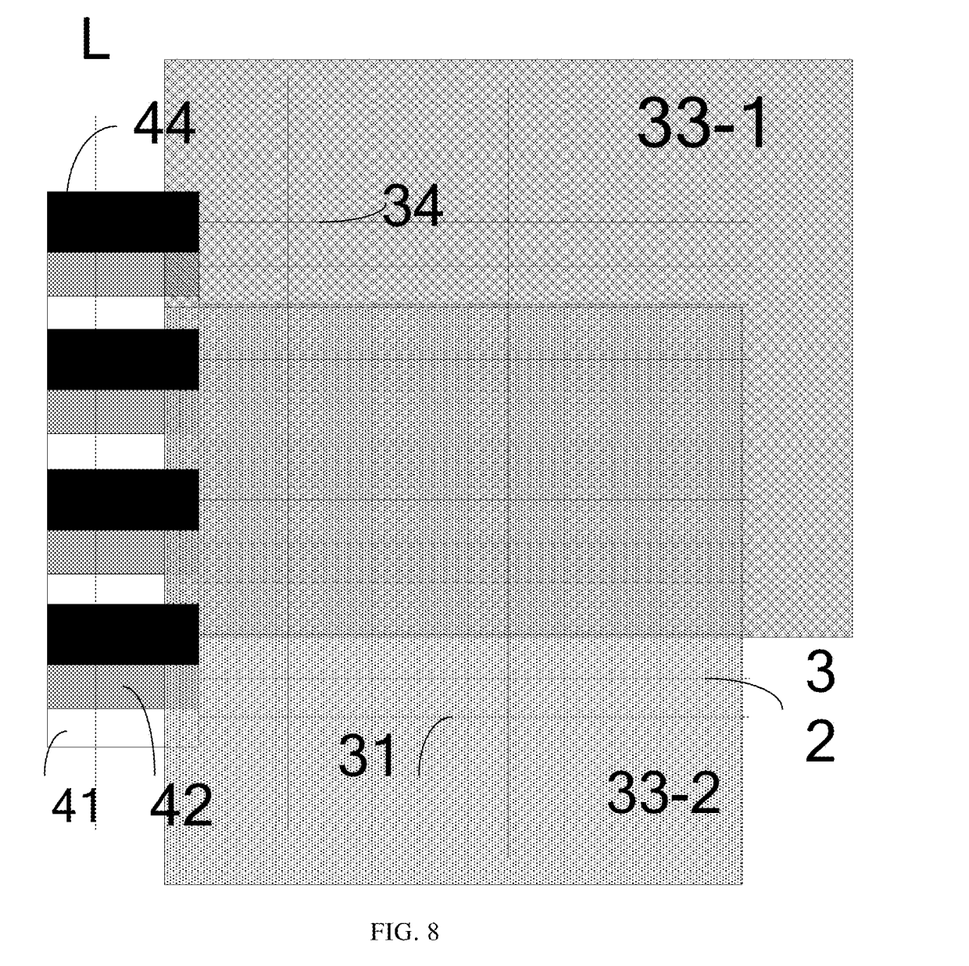
FIG. 8 is a schematic top view showing another distribution of electrode lines in a frame wiring region in a display substrate according to an embodiment of the present disclosure.

FIG. 6-1 illustrates a cross-sectional view of a display substrate according to an embodiment of the present disclosure. FIG. 6-2 illustrates another cross-sectional view of a display substrate according to an embodiment of the present disclosure. FIG. 7 shows a schematic top view of a distribution of electrode lines in a frame wiring region in a display substrate according to an embodiment of the present disclosure. FIG. 8 shows a schematic top view of another distribution of electrode lines in a frame wiring region in a display substrate according to an embodiment of the present disclosure. As shown in FIG. 7, this embodiment provides a display substrate, which includes a display region 1 and a non-display region 2. A plane parallel to the display substrate is taken as a projection plane, and electrode lines in the non-display region are distributed in different layers, and orthogonal projections, on the projection plane, of the electrode lines distributed in different layers are overlapped, similar to FIGS. 2, 3, and 4. It is to be noted that in FIG. 7, the electrode lines are represented by thin lines for simplicity of illustration.

It should be noted that, in the embodiment, the orthographic projections, on the projection plane, of the electrode lines distributed in different layers form an entire region. The arrangement width of the electrode lines 3 in the frame wiring region 2 can be reduced, as long as the orthogonal projections, on the projection plane, of the electrode lines distributed in different layers are overlapped in the entire region (in other words, for at least one of the electrode lines located in one layer, its orthogonal projection on the projection plane is overlapped with the orthogonal projection on the projection plane of at least one of the electrodes lines in another layer).

The non-display region 2 is the frame region of the display substrate. By distributing the electrode lines of the non-display region 2 in different layers, and overlapping the orthogonal projections, on the projection plane, of the electrode lines distributed in different layers, the arrangement width of the electrode lines in the non-display region can be greatly narrowed, as compared with a case where the electrode lines in the non-display region are all distributed in a same layer. As a result, the width and area of the frame occupied by the electrode lines in the non-display region can be greatly reduced, so as to realize the narrow frame of the display substrate.

Figure 61:
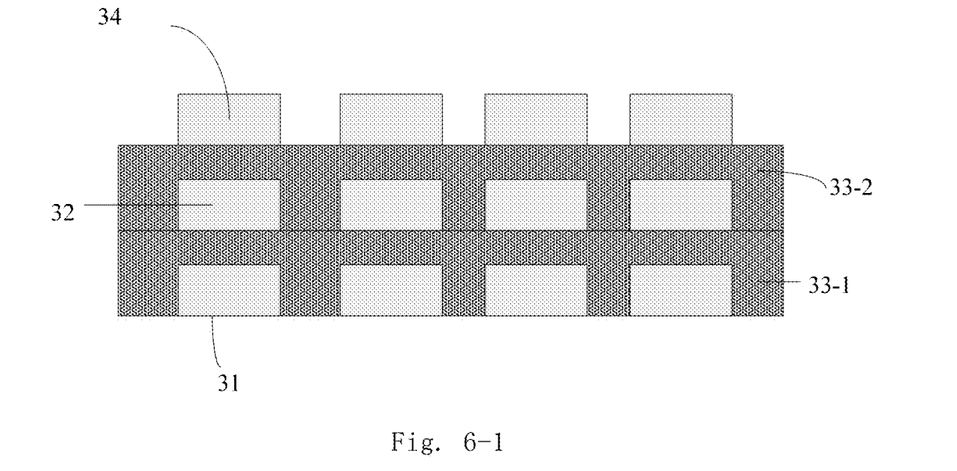
Figure 62:
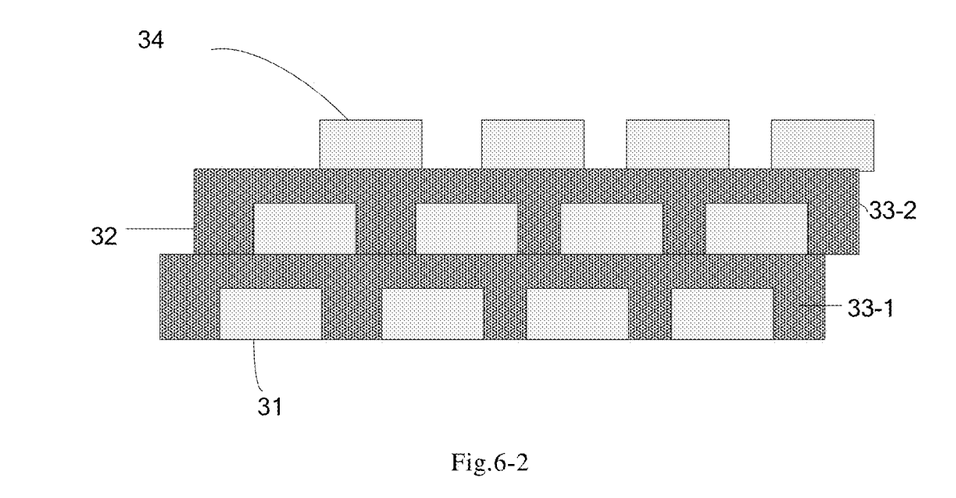

FIG. 6-1 illustrates a cross-sectional view of a display substrate according to an embodiment of the present disclosure. As shown in FIGS. 6-1 and 6-2, the electrode lines of the non-display region include gate lines 31, data lines 32, and common electrode lines 34. The gate lines 31, the data lines 32, and the common electrode lines 34 are respectively located in different layers (e.g., three different layers), and insulating layers 33-1 and 33-2 are provided between adjacent layers. It should be noted that the orthogonal projections, on the projection plane, of the gate lines 31, the data lines 32, and the common electrode lines 34 may be completely overlapped, as shown in FIG. 6-1. Alternatively, the orthographic projections, on the projection plane, of the gate lines 31, the data lines 32, and the common electrode lines 34 may be partially overlapped with each other, as shown in FIG. 6-2, and in this way, the signal interference between the gate lines 31, the data lines 32 and the common electrode lines 34 can be reduced, so as to ensure the stability of the signal transmission.

Compared with a case where the gate lines, the data lines, and the common electrode lines arranged in the non-display region are arranged in a same layer, the arrangement width of the gate lines, the data lines, and the common electrode lines in the non-display region of the display substrate in the present embodiment is greatly narrowed, so as to realize the narrow frame of the display substrate.

FIG. 7 shows a schematic top view of a distribution of electrode lines in a frame wiring region in a display substrate according to an embodiment of the present disclosure. As shown in FIG. 7, in the present embodiment, in the non-display region, each electrode connected with an electrode line is located in the layer where the electrode line is located. The electrodes in different layers form different straight lines (i.e., the electrodes in each layer form a straight line). The orthographic projections of the straight lines, on the projection plane, are parallel to each other. The projections are parallel to each other. In an embodiment, in the non-display region, the electrodes 41 connected to the gate lines 31 are located in the layer where the gate lines are located, the electrodes 42 connected to the data lines 32 are located in the layer where the data lines 32 are located, and the electrodes 44 connected to the common electrode lines 34 are located in the layer where the common electrode lines 34 are located. The electrodes 41 connected with the gate lines 31 are arranged to form a third straight line L3, the electrodes 42 connected with the data lines 32 are arranged to form a fourth straight line L4, and the electrodes 44 connected with the common electrode lines 34 are arranged to form a fifth straight line L5. The third straight line L3, the fourth straight line L4, and the fifth straight line L5 are parallel to each other and staggered.

With this arrangement, on the one hand, the electrodes connected with the gate lines, the electrodes connected with the data lines, and the electrodes connected with the common electrode lines can be exposed, so that the electrodes connected with the gate lines, the electrodes connected with the data lines, and the electrodes connected with the common electrode lines can be normally bound to the binding connection terminal of the peripheral circuit board; on the other hand, the third straight line, the fourth straight line, and the fifth straight line all extend along the width direction of the non-display region, and the electrodes extending in the width direction of the non-display region can be arranged in three different layers, as a result, the arrangement width of the electrodes in the width direction of the non-display region is narrowed, as compared with a case where the electrodes are sequentially distributed in a same layer along the width direction of the non-display region, thereby greatly reducing the width and area of the frame occupied by the electrodes in the non-display region, so as to realize the narrow frame of the display substrate.

It should be noted that, based on the above arrangements of the electrodes in this embodiment, the binding electrodes of the binding connection terminal of the peripheral circuit board used for binding with the display substrate also need to be disposed in three layers that are insulated from each other. In the binding, the normal binding connection between the binding connection terminal and the display substrate can be realized, as long as the binding electrodes of the binding connection terminal of the peripheral circuit board can be connected to the electrodes in different layers of the display substrate in a one-to-one correspondence.

FIG. 8 shows a schematic top view of another distribution of electrode lines in a frame wiring region in a display substrate according to an embodiment of the present disclosure.

This embodiment provides a display substrate. In the non-display region, each electrode connected with an electrode line is located in the layer where the electrode line is located. The electrodes in different layers form different straight lines, and the orthogonal projections of the straight lines on the projection plane are overlapped.

In the non-display region, the electrodes 41 connected with the gate lines 31 are located in the layer where the gate lines are located, the electrodes 42 connected with the data lines 32 are located in the layer where the data lines are located, and the electrodes 44 connected with the common electrode lines 34 are located in the layer where the common electrode lines are located. The electrodes 41 connected with the gate lines 31, the electrodes 42 connected with the data lines 32, and the electrodes 44 connected with the common electrode lines 34 are arranged to form different straight lines whose orthogonal projections on the projection plane are in a straight line L, the straight line L extends along the width direction of the non-display region of the display substrate, and as a result, the width of the non-display region is not increased additionally. In addition, the gate lines, the data lines, and the common electrode lines are respectively distributed in three different layers, and with such arrangement of the electrode lines and the electrodes, the width of the non-display region can be greatly reduced, so as to realize the narrow frame of the display substrate.

It should be noted that, based on the above arrangement of the electrode in the embodiment, the binding electrodes of the binding connection terminal of the peripheral circuit board used for binding with the display substrate can be arranged in a conventional manner. The normal binding connection between the bonding connection terminal and the display substrate can be realized without changing the arrangement of the bonding electrode.

By distributing the electrode lines of the non-display region 2 in different layers, and overlapping the orthogonal projections, on the projection plane, of the electrode lines distributed in different layers, the arrangement width of the electrode lines in the non-display region can be greatly reduced, as compared with a case where the electrode lines in the non-display region are all distributed in the same layer. As a result, the width and area of the frame occupied by the electrode lines in the non-display region can be greatly reduced, so as to realize the narrow frame of the display substrate.

An embodiment according to the present disclosure provides a display panel including the display substrate of the present disclosure.

With the display substrate of the present disclosure, the frame of the display panel can be narrowed, so as to realize the narrow frame of the display panel.

The display panel provided by the present disclosure may be any product or component having a display function such as a liquid crystal panel, a liquid crystal television, an OLED panel, an OLED television, a display, a mobile phone, a navigator, or the like.

An embodiment according to the present disclosure provides a display device including the touch panel and the display panel in the above embodiments. The touch panel is configured to perform touch control on display of the display panel.

According to the display device of the present disclosure, the frame of the display device can be narrowed, so as to realize the narrow frame of the display device.

It should be understood that the above implementations are merely exemplary embodiments for the purpose of illustrating the principles of the present disclosure, but the present disclosure is not limited thereto. It will be apparent to those skilled in the art that various variations and modifications can be made without departing from the spirit and essence of the present disclosure, and these variations and modifications are also regarded as falling into the scope of the present disclosure.

What is claimed is:

1. A touch control substrate, comprising a touch region and a frame wiring region, wherein a plurality of electrode lines in the frame wiring region are distributed in different layers, and orthogonal projections, on a projection plane, of the plurality of electrode lines distributed in the different layers are overlapped, the projection plane being a plane parallel to the touch control substrate,
    wherein the plurality of electrode lines in the frame wiring region comprise driving signal lines and sensing signal lines, the driving signal lines are located in a different layer from the sensing signal lines,
    orthogonal projections, on the projection plane, of portions of the driving signal lines extending along a first direction of the touch control substrate are overlapped with orthogonal projections, on the projection plane, of portions of the sensing signal lines extending along the first direction of the touch control substrate.

2. The touch control substrate according to claim 1, wherein an insulating layer is provided between adjacent layers.

3. The touch control substrate according to claim 2, wherein the orthogonal projections of the portions of the driving signal lines on the projection plane are completely overlapped with the orthogonal projections of the portions of the sensing signal lines on the projection plane.

4. The touch control substrate according to claim 2, wherein the orthogonal projections of the portions of the driving signal lines on the projection plane are partially overlapped with the orthogonal projections of the portions of the sensing signal lines on the projection plane.

5. The touch control substrate according to claim 1, wherein in the frame wiring region, each electrode line and an electrode connected thereto are in a same layer, electrodes in different layers are arranged to form different straight lines, and orthogonal projections of the different straight lines on the projection plane are parallel to each other, each electrode connected to an electrode line is configured to be bonded with a binding connection terminal of a peripheral circuit board.

6. The touch control substrate according to claim 2, wherein in the frame wiring region, each electrode line and an electrode connected thereto are in a same layer, electrodes in different layers are arranged to form different straight lines, and orthogonal projections of the different straight lines on the projection plane are parallel to each other, each electrode connected to an electrode line is configured to be bonded with a binding connection terminal of a peripheral circuit board.

7. The touch control substrate according to claim 1, wherein in the frame wiring region, each electrode line and an electrode connected thereto are in a same layer, electrodes in different layers are arranged to form different straight lines, and orthogonal projections of the different straight lines on the projection plane are overlapped with each other, each electrode connected to an electrode line is configured to be bonded with a binding connection terminal of a peripheral circuit board.

8. The touch control substrate according to claim 2, wherein in the frame wiring region, each electrode line and an electrode connected thereto are in a same layer, electrodes in different layers are arranged to form different straight lines, and orthogonal projections of the different straight lines on the projection plane are overlapped with each other, each electrode connected to an electrode line, is configured to be bonded with a binding connection terminal of a peripheral circuit board.

9. A touch control panel, comprising a touch control substrate, which is the touch control substrate of claim 1.

10. A display substrate comprising a display region and a non-display region, wherein a plurality of electrode lines in the non-display region are distributed in different layers, and orthogonal projections, on a projection plane, of the plurality of electrode lines distributed in the different layers are overlapped, the projection plane being a plane parallel to the display substrate, the plurality of electrode lines in the non-display region comprise gate lines, data lines, and common electrode lines;

the gate lines, the data lines, and the common electrode lines are located in different layers, respectively; and orthogonal projections, on the projection plane, of portions of the gate lines extending along a first direction of the touch control substrate; orthogonal projections, on the projection plane, of portions of the data lines extending along the first direction of the touch control substrate; and orthogonal projections, on the projection plane, of portions of the common electrode lines extending along the first direction of the touch control substrate are overlapped with each other.

11. The display substrate according to claim 10, wherein an insulating layer is provided between adjacent layers.

12. The display substrate according to claim 11, wherein the orthogonal projections, on the projection plane, of the portions of the gate lines, the portions of the data lines, and the portions of the common electrode lines are completely overlapped with each other.

13. The display substrate according to claim 11, wherein the orthogonal projections, on the projection plane, of the portions of the gate lines, the data lines, and the portions of the common electrode lines are partially overlapped with each other.

14. The display substrate according to claim 10, wherein in the non-display region, each electrode line and an electrode connected thereto are in a same layer, electrodes in different layers are arranged to form different straight lines, and orthogonal projections of the different straight lines on the projection plane are parallel to each other, each electrode connected to an electrode line is configured to be bonded with a binding connection terminal of a peripheral circuit board.

15. The display substrate according to claim 11, wherein in the non-display region, each electrode line and an electrode connected thereto are in a same layer, electrodes in different layers are arranged to form different straight lines, and orthogonal projections of the different straight lines on the projection plane are parallel to each other, each electrode connected to an electrode line is configured to be bonded with a binding connection terminal of a peripheral circuit board.

16. The display substrate according to claim 10, wherein in the non-display region, each electrode line and an electrode connected thereto are in a same layer, electrodes in different layers are arranged to form different straight lines, and orthogonal projections of the different straight lines on the projection plane are overlapped with each other, each electrode connected to an electrode line is configured to be bonded with a binding connection terminal of a peripheral circuit board.

17. The display substrate according to claim 11, wherein in the non-display region, each electrode line and an electrode connected thereto are in a same layer, electrodes in different layers are arranged to form different straight lines, and orthogonal projections of the different straight lines on the projection plane are overlapped with each other, each electrode connected to an electrode line is configured to be bonded with a binding connection terminal of a peripheral circuit board.

18. A display panel, comprising a display substrate, which is the display substrate of claim 10.

19. A display device, comprising a display panel and a touch control panel configured to perform touch control on display of the display panel;

wherein the display panel comprises a display substrate, and the display substrate comprises a display region and a non-display region, a plurality of electrode lines in the non-display region are distributed in different layers, and orthogonal projections, on a first projection plane, of the plurality of electrode lines distributed in the different layers are overlapped, the first projection plane being a plane parallel to the display substrate;

the plurality of electrode lines in the non-display region comprise gate lines, data lines, and common electrode lines; the gate lines, the data lines, and the common electrode lines are located in different layers, respectively; and orthogonal projections, on the projection plane, of portions of the gate lines extending along a first direction of the touch control substrate; orthogonal projections, on the first projection plane, of portions of the data lines extending along the first direction of the touch control substrate; and orthogonal projections, on the first projection plane, of portions of the common electrode lines extending along the first direction of the touch control substrate are overlapped with each other;

wherein the touch control panel comprises a touch control substrate, the touch control substrate comprises a touch region and a frame wiring region, a plurality of electrode lines in the frame wiring region are distributed in different layers, and orthogonal projections, on a second projection plane, of the plurality of electrode lines distributed in the different layers are overlapped, the second projection plane being a plane parallel to the touch control substrate;

wherein the plurality of electrode lines in the frame wiring region comprise driving signal lines and sensing signal lines, the driving signal lines are located in a different layer from the sensing signal lines; and orthogonal projections, on the projection plane, of portions of the driving signal lines extending along the first direction of the touch control substrate are overlapped with orthogonal projections, on the second projection plane, of portions of the sensing signal lines extending along the first direction of the touch control substrate.

* * * * *